(12) United States Patent
Laing

(10) Patent No.: US 7,648,347 B2
(45) Date of Patent: Jan. 19, 2010

(54) DEVICE FOR THE LOCAL COOLING OR HEATING OF AN OBJECT

(75) Inventor: Oliver Laing, Stuttgart (DE)

(73) Assignee: ITT Manfacturing Enterprises, Inc., Wilmington, DE (US)

( * ) Notice: Subject to any disclaimer, the term of this patent is extended or adjusted under 35 U.S.C. 154(b) by 315 days.

(21) Appl. No.: 11/653,463

(22) Filed: Jan. 16, 2007

(65) Prior Publication Data

US 2007/0115634 A1    May 24, 2007

Related U.S. Application Data

(63) Continuation of application No. 10/434,307, filed on May 7, 2003, now abandoned.

(30) Foreign Application Priority Data

Sep. 13, 2002    (DE) ............................... 102 43 026

(51) Int. Cl.
 F04B 35/04    (2006.01)
 F28D 15/00    (2006.01)
 H05K 7/20    (2006.01)
(52) U.S. Cl. ............. 417/313; 417/423.14; 417/423.15; 165/104.33; 361/702
(58) Field of Classification Search ............ 417/423.15, 417/313, 423.14; 165/104.33, 80.4; 361/699, 361/701–703
See application file for complete search history.

(56) References Cited

U.S. PATENT DOCUMENTS

| | | | |
|---|---|---|---|
| 4,352,646 A * | 10/1982 | Laing et al. .................. | 417/420 |
| 4,728,268 A | 3/1988 | Laing | |
| 4,740,866 A * | 4/1988 | Kajiwara et al. ............ | 361/702 |
| 4,874,300 A | 10/1989 | Laing et al. | |
| 5,049,982 A | 9/1991 | Lee et al. | |
| 5,195,020 A | 3/1993 | Suzuki et al. | |
| 5,375,979 A | 12/1994 | Trah | |
| 5,646,824 A | 7/1997 | Ohashi et al. | |
| 5,731,954 A | 3/1998 | Cheon | |
| 6,019,165 A | 2/2000 | Batchelder | |
| 6,074,092 A * | 6/2000 | Andrews ..................... | 378/200 |
| 6,132,184 A | 10/2000 | Robertson et al. | |
| 6,152,213 A | 11/2000 | Suzuki | |

(Continued)

FOREIGN PATENT DOCUMENTS

DE    35 38 504 C2    10/1985

(Continued)

OTHER PUBLICATIONS

Strömer, Gerald, *In PCs ab 2000 Euro gehört eine Wakü*, PC DIREKT May 2002.

(Continued)

*Primary Examiner*—Charles G Freay
(74) *Attorney, Agent, or Firm*—Foley & Lardner LLP

(57) ABSTRACT

A device for the local cooling or heating of an object by means of a fluid is disclosed. The device comprises a circulation pump for the fluid. A thermal contact element for making thermal contact with the object is integrated in the circulation pump. The circulation pump has a housing part which is flexible and/or movable, the housing part being the thermal contact element.

22 Claims, 4 Drawing Sheets

U.S. PATENT DOCUMENTS

| | | | |
|---|---|---|---|
| 6,327,145 B1 | 12/2001 | Lian et al. | |
| 6,408,937 B1 | 6/2002 | Roy | |
| 6,668,911 B2 * | 12/2003 | Bingler | 165/80.4 |
| 6,986,640 B2 * | 1/2006 | Laing | 415/126 |

FOREIGN PATENT DOCUMENTS

| | | |
|---|---|---|
| DE | 38 52 845 T2 | 5/1988 |
| DE | 690 30 288 T2 | 7/1990 |
| DE | 42 20 077 A1 | 6/1992 |
| EP | 1 085 217 A2 | 3/2001 |
| JP | 09-112479 | 5/1997 |
| JP | 2001-320187 | 11/2001 |
| WO | WO 03/098415 A1 | 11/2003 |

OTHER PUBLICATIONS

Der Unschlagbare, CHIP, Oct. 2002.

European Search Report dated Jan. 21, 2004 for European Application No. 03019804.8-1267.

* cited by examiner

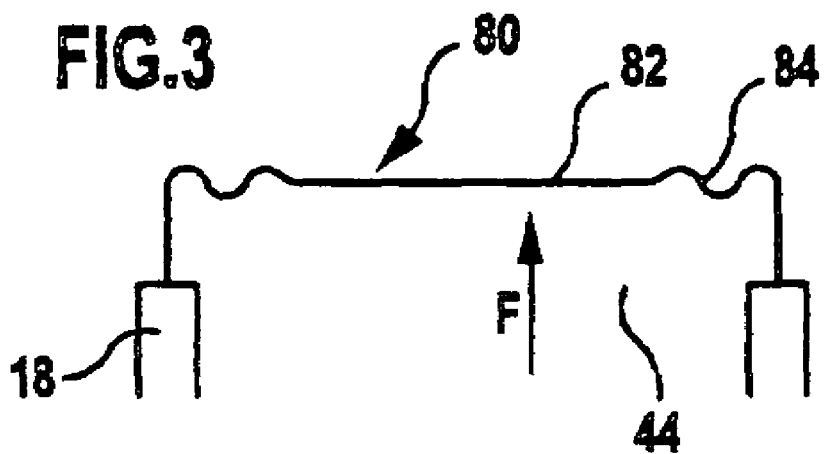
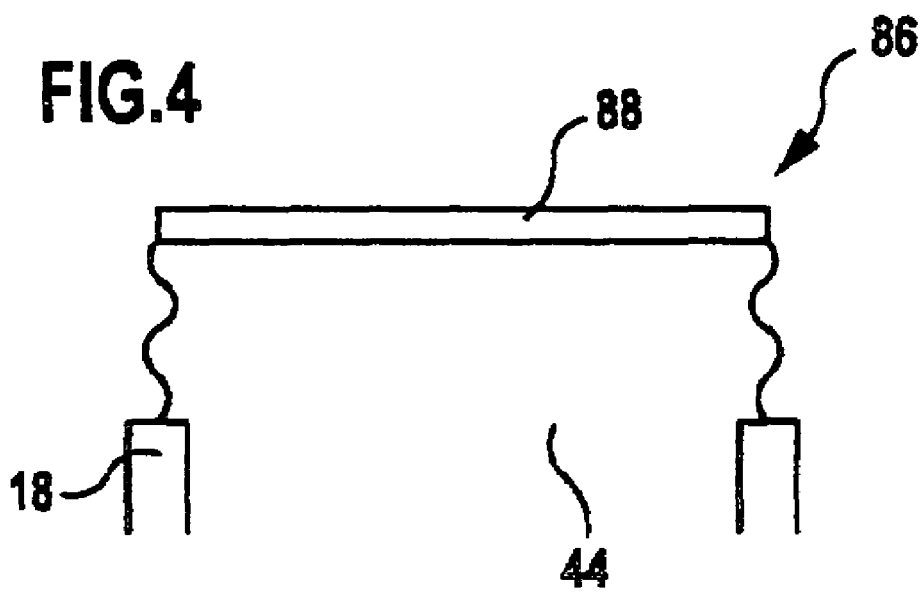
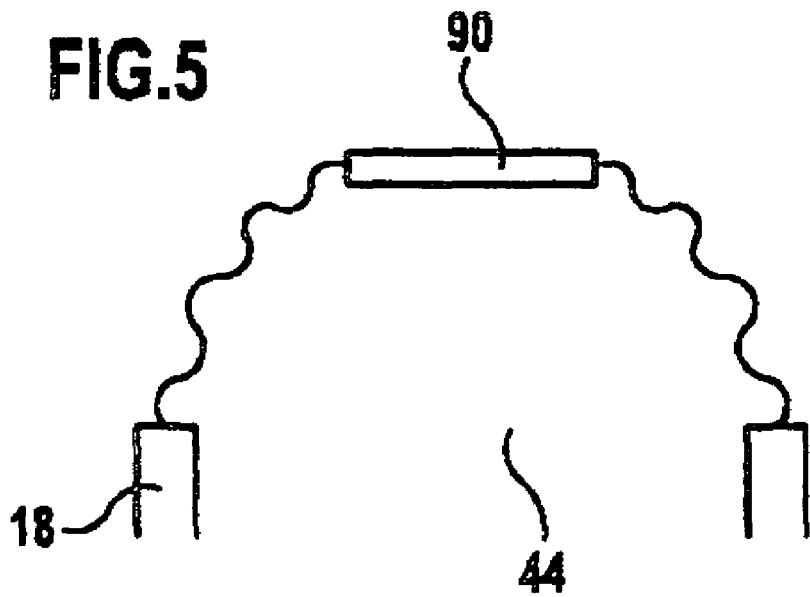

DEVICE FOR THE LOCAL COOLING OR HEATING OF AN OBJECT

RELATED APPLICATION

The present application is a Continuation of U.S. application Ser. No. 10/434,307, entitled "Device For The Local Cooling or Heating of an Object", filed May 7, 2003 now abandoned which is incorporated by reference herein in its entirety. The present disclosure relates to the subject matter disclosed in German application No. 102 43 026.8 of Sep. 13, 2002, which is incorporated herein by reference in its entirety and for all purposes.

FIELD OF THE INVENTION

The invention relates to a device for the local cooling or heating of an object by means of a liquid, comprising a circulation pump for the liquid.

Devices of this type are used, for example, for the liquid cooling of microprocessors.

SUMMARY OF THE INVENTION

In accordance with the invention, a device for the local cooling or heating of an object is provided which is of simple design since a thermal contact element for making thermal contact with the object is integrated in the circulation pump.

Therefore, according to an embodiment of the invention, a thermal contact element such as a heat sink or heater which is brought into contact with the object is part of the circulation pump. In this way, it is possible to achieve a compact design of a liquid cooling device or heating device with effective cooling or heating of the object with which contact is made.

Furthermore, it is possible to achieve a high level of efficiency with regard to the cooling or heating, since a fluid is accelerated before it is brought in contact with the thermal contact element, and the flow which is generated makes it possible to achieve good thermal contact with the thermal contact element. It is then possible for heat to be optimally dissipated or optimally supplied. It is also possible to use the circulation pump to establish a flow pattern which is optimal for the removal (dissipation) of heat or supply of heat.

By suitably shaping the thermal contact element, in particular such that it is matched to a contact surface of the object, it is possible to achieve a good cooling function or heating function in combination with minimized dimensions.

In particular, it is advantageous if the thermal contact element is part of a housing of the circulation pump. As a result, the device can be produced in a simple way. Furthermore, with suitable positioning of the circulation pump it is possible to achieve a cooling function or heating function with regard to the object: the circulation pump is positioned with the thermal contact element on the object and is fixed with respect thereto, for example by means of clips or positively locking connections.

In particular, it is provided that the thermal contact element constitutes a housing cover of the circulation pump, so that the thermal contact element does not form an additional component and the circulation pump and therefore also the device can be produced in a simple way.

In particular, in this case the thermal contact element is a boundary of a swirl chamber of the circulation pump and confines the swirl chamber at least at one end thereof. In the swirl chamber, a swirl is produced in the liquid, and at an outlet this swirl is converted in a spiral pump housing into pressure for circulation of the liquid. If the thermal contact element confines the swirl chamber, it is possible to achieve optimum thermal coupling between liquid and thermal contact element and therefore in turn to achieve an optimum dissipation of heat from or supply of heat to the object.

In particular, an impeller (paddle wheel), which is driven, for example, as part of an electric motor and by means of which a swirl can be generated in the liquid, is rotatably arranged in the swirl chamber.

It is also possible for the circulation pump to have a cover plate, in particular in the form of a covering disk for the paddle wheel. A cover plate usually increases the pump output, while without a cover plate the flow velocity is higher. The use or omission of a cover plate makes it possible to establish the optimum conditions for the specific application.

It is very particularly advantageous if a through-flow which is generated by means of the impeller is guided past the thermal contact element. By guiding by this flow, it is possible to achieve optimum thermal coupling between circulation pump and the object, so that once again optimum cooling or heating can be achieved.

If the impeller is arranged facing the thermal contact element, it is possible to establish optimized flow guidance in order to dissipate heat from the thermal contact element or to supply heat to the thermal contact element.

In a variant of an exemplary embodiment, the thermal contact element is made from a metallic material, such as copper, in order to achieve a high thermal conductivity, in order, in turn, to allow optimum dissipation of heat from an object or optimum supply of heat to an object.

If the thermal contact element is formed as a plate, which in particular has a constant height, it is possible to avoid heat peaks (hot spots) in the thermal contact element.

In principle, it is possible for the circulation pump to comprise an electric motor, such as a cylinder motor, a disk motor or an external rotor motor, or for it to be driven by means of a permanent-magnetic coupling.

However, it is very particularly advantageous if the circulation pump is a centrifugal pump with a spherical electric motor. It is then possible to achieve a play-free bearing of a rotor, so that firstly a long service life and therefore a high reliability of the circulation pump are ensured. Secondly, with a substantially spherical bearing, the noise produced is minimized, so that there is reduced operating noise. Furthermore, the overall height (parallel to the axis of rotation of the rotor) can be minimized in a centrifugal pump.

In particular, a substantially spherical bearing for a rotor of the circulation pump is provided, in order to obtain a play-free bearing while minimizing the overall height.

Furthermore, it is expedient if the circulation pump comprises an electric motor having a stator and a rotor, between which a substantially spherical air gap is formed. A centrifugal pump having an electric motor of this type is disclosed by U.S. Pat. No. 4,728,268 and DE 35 38 504 C2, to which reference is hereby expressly made.

Furthermore, it is expedient if there is coaxial flow through the circulation pump at least in the region between an inflow region and an outflow region, in order in this way to obtain optimum distribution of the cooling or heating liquid to the thermal contact element.

To minimize the dimensions of the device according to the invention, a feed line for liquid medium is advantageously connected to a housing of the circulation pump transversely with respect to an axis of rotation of a rotor of the circulation pump, and/or a discharge line for liquid medium is advantageously connected to a housing of the circulation pump transversely with respect to an axis of rotation of a rotor of the circulation pump. In this context, in particular the feed line and/or discharge line is/are connected to the housing at right angles with respect to the axis of rotation. As a result, liquid medium can be supplied or discharged laterally, so that the overall height of the device is not increased.

If a discharge line for discharging liquid medium from the circulation pump and a feed line for feeding liquid medium to the circulation pump are connected to the same side of a housing of the circulation pump, it is also possible to minimize the lateral dimensions of the device and in particular the space required to form a loop for the liquid medium.

The thermal contact element is advantageously arranged on the pressure side of the circulation pump (and not on the suction side), in order in this way to obtain optimum flow guidance and in particular to be able to apply a flow with a high degree of turbulence to the thermal contact element, in order in turn to achieve optimum thermal coupling.

To increase the thermal contact surface area of the liquid in the thermal contact element, it is possible for the thermal contact element to have fins on its inner side. These may, for example, be circular or spiral walls.

In a variant of an embodiment, the fins are formed in such a way as to promote turbulence, in order in this way to further improve the thermal coupling.

In a variant of an embodiment, it is provided that in an air gap between a stator and a rotor, blades are arranged on the rotor, in order in particular to generate additional swirl in the liquid. The blades are disposed in such a way that the spherical geometry is substantially retained.

It is advantageous for a swirl chamber of the circulation pump to have a variable volume and in particular for a confining element of the swirl chamber to be able to move relative to the remainder of the housing. In this way, it is possible to provide an expansion volume for the liquid without having to provide separate expansion means. (The liquid expands when heated.) Furthermore, in this way it is possible to exert an initial pressure in order in particular to prevent air from entering into the system.

In particular, it is provided that the circulation pump has a housing part which is formed flexibly and/or is movable, and in particular is disposed movably on the housing, in such a manner that it is possible to exert a positive pressure on the system. In this way, it is possible to prevent air from entering into the system. By way of example, the housing part may be a flexible plate, a flexible diaphragm or a bellows.

Furthermore, it is expedient if the circulation pump has a housing part which is formed flexibly and/or is movable in such a manner that it is possible to provide an expansion volume for the liquid, so that there is no need to provide any separate expansion vessels in a liquid circuit.

It is possible for the flexible and/or movable housing part to be arranged on the opposite side of the housing from the contact element, and in particular to be arranged on a suction side of the housing. The corresponding housing part is in this case arranged substantially parallel to a surface of the object which is to be cooled or heated and in particular is oriented parallel to the contact element. However, the flexible and/or movable housing part may also be formed by the contact element itself.

The thermal contact element is then of flexible form and/or is mounted movably on a housing of the circulation pump. Then, by way of example, the thermal contact element is formed as a flexible plate which, however, still has sufficient inherent rigidity. In this way, it is possible to provide an expansion volume for the liquid after heating and also to exert a positive pressure on the system.

It is also possible for the thermal contact element to be a thin diaphragm which positions itself against the object or is surrounded by a bellows.

In particular, it is provided that a positive pressure can be exerted on the system by means of a fixing device for fixing the circulation pump to the object. A fixing device of this type can be used to fix the circulation pump with the contact element on or with respect to the object which is to be cooled or heated. This can be achieved by exerting a corresponding holding force. This holding force can also be used to exert the positive pressure, it being possible for the force to act directly on the flexible and/or movable housing part or for this force to be imparted via the holding force.

In particular, it is provided that the circulation pump is held with respect to the object by means of one or more clips. In this way, it is possible to achieve simple fixing of the circulation pump and therefore of the device for local cooling or heating with respect to the object.

The following description of preferred embodiments, in combination with the drawing, serves to provide a more detailed explanation of the invention.

BRIEF DESCRIPTION OF THE DRAWINGS

FIG. 3 shows a schematic illustration of an exemplary embodiment of a thermal contact element;

FIG. 4 shows a further exemplary embodiment of a thermal contact element;

FIG. 5 shows a further exemplary embodiment of a thermal contact element;

DETAILED DESCRIPTION OF THE INVENTION

Figure 1:
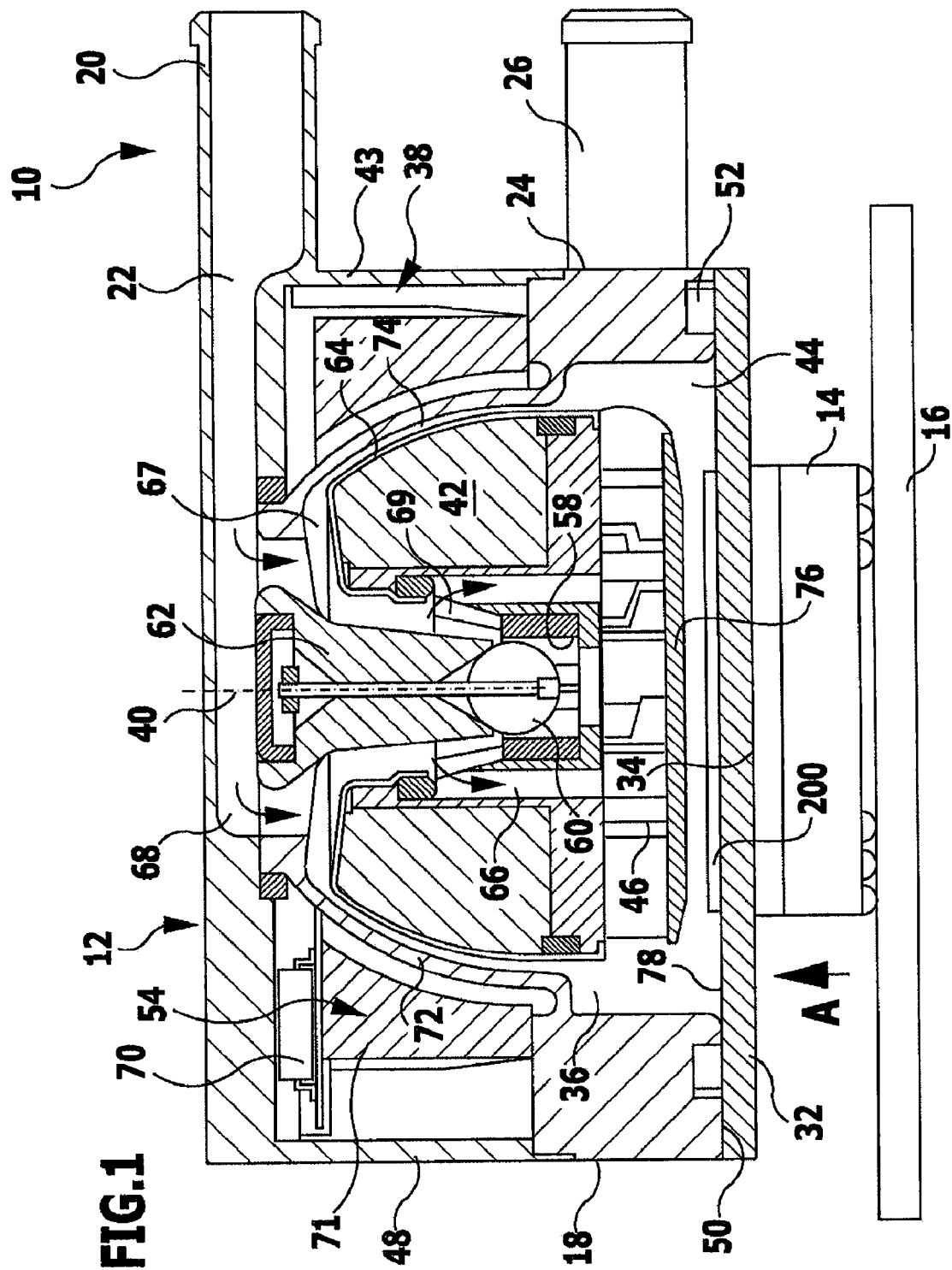
FIG. 1 shows a partially cutaway view of an exemplary embodiment of a device according to the invention for the local cooling or heating of an object.
Figure 2:
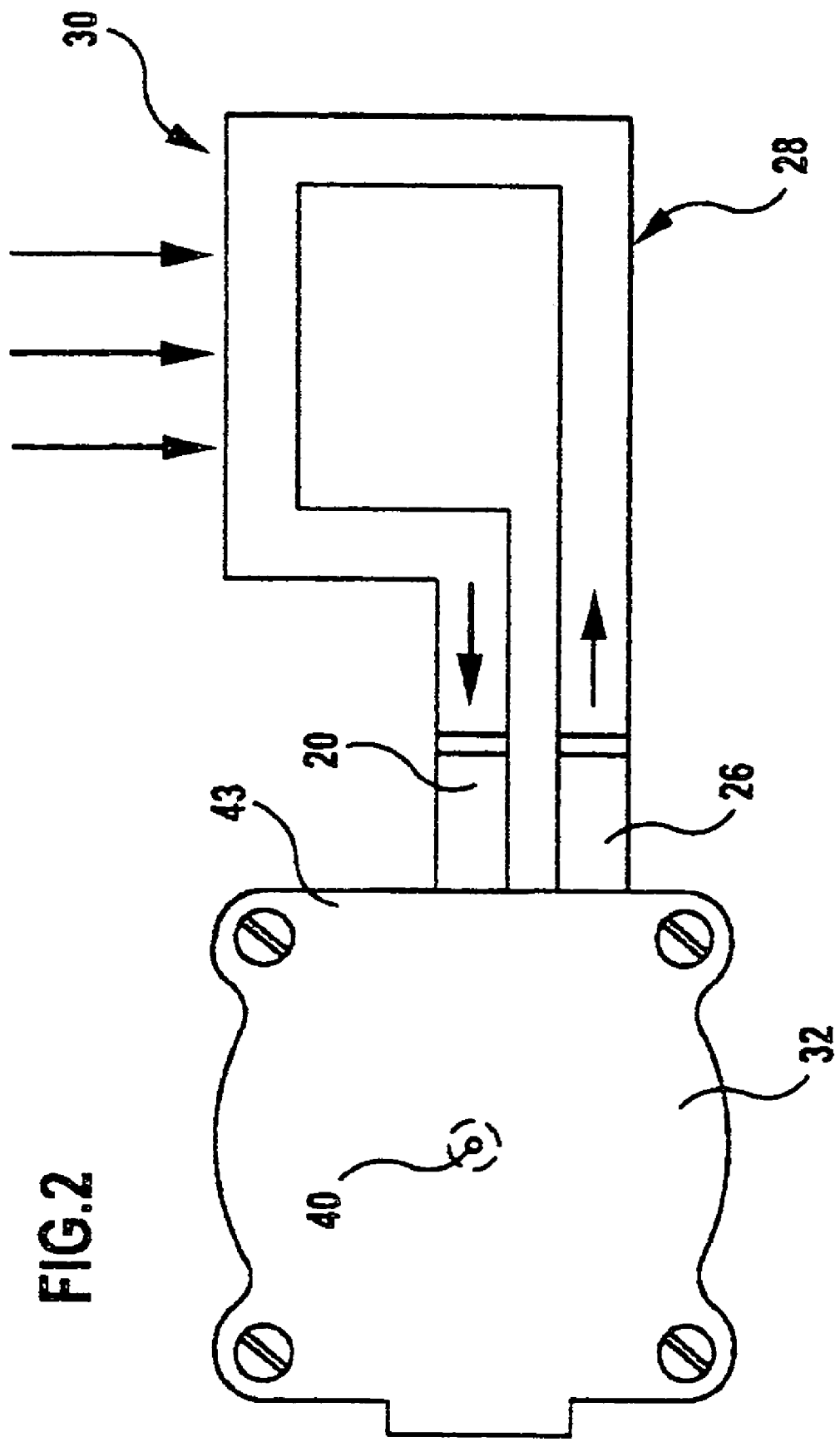
FIG. 2 shows a plan view in the direction A of the device shown in FIG. 1.

An exemplary embodiment of a device according to the invention for the local cooling or heating of an object, which is denoted overall by 10 in FIG. 1, comprises a circulation pump 12, by means of which a fluid, such as water or other liquids, can be guided in a loop (FIG. 2) as a heat transfer medium. The heat transfer medium can be used as a cooling medium, in order to cool an object 14, such as for example an electronic component, such as a processor, which is positioned on a circuit board 16, for example. The heat transfer medium can also be used for heating an object.

The circulation pump 12 comprises a housing 18. A feed line 20 is provided to allow a fluid to enter into the housing 18 by means of an opening 22 leading into a suction side of the circulation pump 12. A discharge line 26 leads away from the housing 18 via an opening 24 from a pressure side (delivery side) of the circulation pump 12.

The housing 18 may be pressed onto the object 14, for example by means of pressure-exerting clips (not shown).

If the device is used as a cooling device, a cooling fluid, such as water, is supplied via the feed line 20, and heated cooling liquid which has been heated as a result of the cooling of the object 14, is discharged via the discharge line 26.

If the device is used as a heating device, a heating fluid is supplied via the feed line 20 and then heats the object 14 and, in the process the heating fluid is cooled. The cooled heating liquid is discharged via the discharge line 26.

The discharge line 26 and the feed line 20 are connected to one another outside the housing 18 of the circulation pump 12, in order to form a loop 28 for the liquid. This loop 28 has a cooling section or heating section 30 which is arranged outside the housing 18 and along which heated cooling liquid can be cooled, for example by means of air cooling, or cooled heating medium can be heated. The cooling section or heating section 30 for this purpose has a suitable surface area to allow effective cooling or heating.

The thermal contact between the fluid and the object 14 is provided by a thermal contact element 32 which is integrated into the circulation pump 12. The thermal contact element 32 preferably provides and, in particular, forms a housing cover for the housing 18. The thermal contact element 32 may be, for example, in the shape of a plate and made from a metallic material.

To form the thermal contact, the thermal contact element 32 touches the object 14 over the largest possible surface area. It is preferable for that surface of the thermal contact element 32 which faces the object 14 to be at least as large as a contact surface of the object 14.

An interior space 36, in which an electric motor, denoted overall by 38, is accommodated, is formed in the housing 18 of the circulation pump 12. The electric motor comprises a rotor 42 which can rotate about an axis of rotation 40.

The opening 22 for the feed line 20 and the feed line 20 itself, at least in the region of the opening, and also the opening 24 and the discharge line 26, at least in the region of this opening 24, are oriented transversely, and in particular at right angles, with respect to the axis of rotation 40, in order to be able to maintain a low height of the circulation pump 12 and, therefore, of the device 10 in the direction of the axis of rotation 40.

The opening 22 and the opening 24 are preferably arranged on the same (transverse) side 43 of the housing 18 of the circulation pump 12.

A swirl chamber 44, in which a swirl is imparted to liquid which has been supplied via the feed line 20, using an impeller 46 (paddle wheel) which is connected in a rotationally fixed manner to the rotor 42, and in which swirling liquid flows, is formed in the interior space 36 of the housing 18. Pressure conversion takes place in a spiral housing of the circulation pump 12, in order for the liquid to be pumped through the circuit 28. The liquid is also guided past the thermal contact element 32 in order to transfer heat.

The swirl chamber 44 is formed in the interior space 36 between walls 48, the thermal contact element 32 also being positioned on these walls, facing the object 14. One or more fluid seals 52, for example in the form of O-rings, is/are disposed between end faces 50 of these walls 48 and the thermal contact element 32.

The electric motor 38 of the circulation pump 12 may, for example, be formed as a cylinder motor, as a disk motor or as an external rotor motor, or alternatively the circulation pump may be driven by means of a permanent-magnetic coupling.

In the exemplary embodiment shown in FIG. 1, the circulation pump 12 is formed as a centrifugal pump with a corresponding electric motor 38 which comprises a stator 54, which is connected in a rotationally fixed manner to the housing 18, and a rotatably mounted rotor 42.

The rotor 42 is mounted on a convex sliding partner 60 by means of a bearing cap 58.

The convex sliding partner 60, which is substantially formed in particular as a sphere, is seated on a bearing support 62 which extends in the direction of the axis of rotation 40 and in particular is formed concentrically with respect thereto.

The bearing cap 58 is connected in a rotationally fixed manner to the paddle wheel 46.

The bearing cap 58 on the sliding partner 60 forms a substantially spherical bearing. As a result, the dimensions of the circulation pump 12 for the bearing of the rotor 42 can be minimized in the direction of the axis of rotation 40.

The rotor 42 of the electric motor 38 has a substantially spherical contour facing the walls 48 of the housing 18 (i.e., a contour which matches a partial region of a spherical surface). A wall 64, which is, for example, made from stainless steel, surrounds the rotor 42. The rotor 42 forms a single unit with the paddle wheel 46.

A through-flow region 66, which in particular is arranged concentrically with respect to the axis of rotation 40 and is, for example, approximately annular in cross section (with ribs disposed in the annular space), is formed around the bearing support 62 at the rotor 42. This through-flow region 66 connects an inflow region 68 of the circulation pump 12, which in turn is connected to the feed line 20, to the swirl chamber 44. The paddle wheel 46 is disposed in the swirl chamber 44, so that the pressure side of the circulation pump 12 is formed here, while the inflow region 68 represents the suction side. Then, liquid is guided through the circulation pump 12 via the through-flow space 66, and a swirl is imparted to the liquid which is conducted through by the paddle wheel 46; the pressure required to pump the liquid through the loop 28 is then produced.

The bearing support 62 is held on the housing 18 by means of radial ribs 67, it being ensured that the liquid can flow past. The bearing cap 58 is held in a rotationally fixed manner on the rotor 42 by means of radial ribs 69, it once again being ensured that the liquid can flow past in order to form the through-flow region 66.

In a variant of an embodiment, a circuit board 70 is positioned in the housing 18. Coils for the motor and electrical connectors for the coils may be mounted on the circuit board 70.

The stator 54 is formed by means of coil windings (not shown in the drawing) and magnetic return path elements 71 (yoke elements).

Between the rotor 42 and the stator 54 there is a substantially spherical wall 72 which is made, for example, from a plastics material. Between the rotor 42 and the spherical stator 54 an air gap 74 is defined, which is substantially spherical, i.e. is bounded with respect to the wall 72 by a part of a substantially spherical surface and is likewise bounded with respect to the rotor 42 by part of a substantially spherical surface, the two spherical surfaces lying essentially concentrically with respect to one another. The centers of the spheres lie on the axis of rotation 40 in the center of the sliding partner 60, via which, once again by means of the bearing cap 58, the rotor 42 is mounted rotatably in the housing 18 of the circulation pump 12. The spherical surfaces may be slightly non-concentric with regard to the direction along the axis of rotation 40.

The paddle wheel 46 is positioned in the swirl chamber 44, facing the thermal contact element 32. It is possible for the paddle wheel 46 to be provided with a cover plate 76 facing the thermal contact element 32.

The device 10 according to the invention for cooling or heating the object 14 functions in the following way:

The housing 18 of the circulation pump 12 is positioned with respect to the object 14 in such a way that the thermal contact element 32 is seated on the contact surface 34 of the object 14.

By way of example, the object 14 is a microprocessor which is to be cooled using water.

Then, cooling water is guided in the loop 28, by the circulation pump 12, past an inner side 78 of the thermal contact element 32, which is opposite to the contact surface 34 of the object 14.

In this arrangement, it is possible for this inner side 78 to have fins 200 in order to increase the surface area, these fins being provided in particular with a structure which increases the turbulence. By way of example, circular or spiral walls project toward the paddle wheel 46. In this way, the flow and in particular the flow of the cooling water past the thermal contact element 32 can be improved and the thermal contact can be improved, so that heat can be optimally dissipated and as a result the object 14 can be optimally cooled.

Cool cooling water is guided into the inflow region 68 via the feed line 20. It then flows through the through-flow region 66 coaxially with respect to the axis of rotation 40. A swirl is imparted to this cooling water by the paddle wheel 46; this is then followed by pressure conversion in the spiral housing, in order to pump the cooling water through the loop 28.

At the paddle wheel 46, the cooling water flows spirally outward with respect to the axis of rotation 40 and past the inner side 78 of the thermal contact element 32. As a result, heat can be dissipated from the thermal contact element 32 and therefore in turn from the object 14 through the cooling water, which correspondingly has taken up this heat.

The cooling section 30 has, by way of example, a heat-transfer surface area which is three times to thirty times larger than the surface area of the inner side 78 of the thermal contact element 32 via which heat can be dissipated to the cooling water.

As an alternative or in addition to the paddle wheel 46, it is possible for blades to be disposed on the rotor 42 in the air gap 74, with the spherical symmetry of the arrangement being substantially retained.

According to the invention, a centrifugal pump is provided as circulation pump 12, with substantially spherical bearing of the rotor 42. This spherical bearing via the bearing cap 58 and the sliding partner 60 results in a high freedom of play and therefore a long service life of the circulation pump 12 combined, at the same time, with a low level of noise being produced during operation.

Furthermore, it is possible to produce low overall heights in the direction of the axis of rotation 40, so that it is possible to produce a compact device for example for cooling a microprocessor 14. The fact that the thermal contact element 32 is integrated in the circulation pump 12, and in particular the fact that it is designed as a housing cover, means that it is possible to achieve a simple and space-saving structure of the device 10. In particular, there is no need for an external thermal contact element. The high flow velocities within the housing 18 of the circulation pump 12 can be utilized directly to dissipate heat from the object 14. The paddle wheel 46 directly faces the thermal contact element 32 and therefore the object 14.

In the exemplary embodiment shown in FIG. 1, the thermal contact element 32 is formed as a rigid plate which is made from a material with a good thermal conductivity, such as copper.

It is also possible for the thermal contact element to be elastic. In an exemplary embodiment which is shown in FIG. 3, a flexible plate 80 is provided as thermal contact element 32, this flexible plate having sufficient inherent rigidity. In particular, the flexible plate 80 comprises a thermal contact region 82 and a flexibility region 84, in order to effect optimum contact between the plate 80 and the object 14.

The flexibility of the thermal contact element 80 means that the volume of the swirl chamber 44 is variable. As a result, it is possible to absorb expansion of the liquid without any load being imposed on the housing 18. Moreover, in this way it is possible to exert a pressure bias on the system.

It is also possible for the thermal contact element to comprise a membrane which rests against the object 14 or to comprise a flexible membrane.

In an exemplary embodiment which is shown in FIG. 4, the thermal contact element comprises bellows 86 with a contact plate 88 for placing onto the object 14. The fact that the structure is formed as bellows 86 means that the contact plate 88 is moveable relative to the paddle wheel 46, with the result that, once again, the volume of the swirl chamber 44 can be varied.

It is also possible to provide a thermal contact element 90 in conical form, as shown in FIG. 5, which may be a rigid arrangement or a flexible arrangement.

The device 10 according to the invention can also be used for local heating of the object 14 via the thermal contact element 32 and the contact surface 34 of the object 14 if, in a corresponding way, in particular hot water is conducted past the inner side 78 of the thermal contact element 32 as heating liquid.

Figure 6:
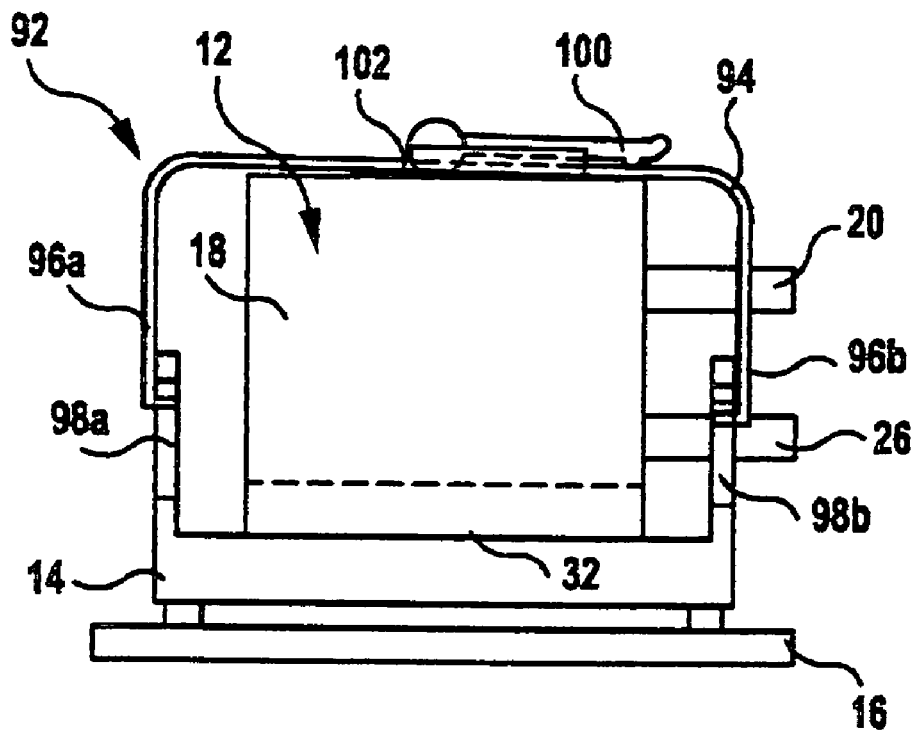
FIG. 6 shows a schematic view of a fixing device for fixing a circulation pump to the object.

As shown in FIG. 6, the circulation pump 12 is fixed to the object 14 which is to be cooled or heated by means of a fixing device 92. By way of example, the fixing device 92 comprises one or more holding clips 94. If there is a plurality of holding clips 94, these clips are spaced apart from one another.

A holding clip 94 is formed in the shape of a bracket and can be placed onto a side of the housing 18 which is remote from the thermal contact element 32. Ends 96a, 96b can be used to fix a holding clip 94 to the object 14, which has corresponding holding recesses 98a, 98b. However, these holding recesses may also be arranged on the circuit board 16 or on a base which holds the circuit board 16.

The holding clip 94 is formed as a clamping bracket with a tensioning lever 100. When this tensioning lever 100 is open, the circulation pump 12 can be placed onto the object 14 or the circulation pump 12 can be pushed into the space between the holding clip 94 and the object 14. If the tensioning lever is then closed, which is the position illustrated in FIG. 6, a force is exerted in the direction of the object 14 via a bracket region 102, with the result that, in turn, the housing 18 of the circulation pump 12 is pressed onto the object 14 and as a result the circulation pump 12 with the contact element 32 is fixed on the object 14 or is fixed with respect to this object 14.

With holding clips 94 of this type, it is possible to achieve rapid fixing of the circulation pump 12 to the object 14 or to rapidly exchange the circulation pump 12.

If the thermal contact element 32 is not formed as a rigid plate, but rather as a flexible contact element or as a contact element which can move with respect to the housing 18, as shown in FIGS. 3 to 5 and outlined in this context, it is possible for a positive pressure to be exerted on the system via the fixing device 92 and the holding clips 94, in order to prevent the penetration of air. In this case, the thermal contact element forms a housing part which is flexible or is mounted movably on the housing 18 and with the aid of which it is possible to exert the positive pressure on the system.

Figure 7:
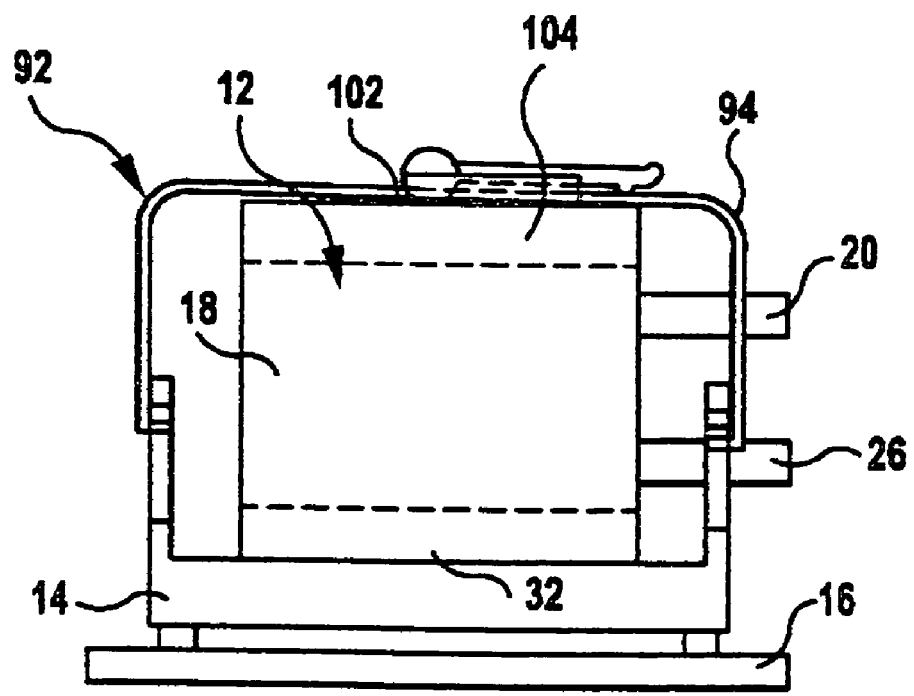
FIG. 7 shows a variant of the exemplary embodiment illustrated in FIG. 6.

It is also possible, as shown in FIG. 7, for a housing part 104 which is not formed by the contact element to be formed flexibly and/or arranged movably on the housing 18. This corresponding housing part 104 may, for example, be formed as bellows, as a flexible plate or as a flexible membrane, as described above. In this case, in particular this housing part 104 is arranged on the opposite side from the thermal contact element 32, parallel to the thermal contact element 32, and in particular parallel to a surface of the object 14. In the exemplary embodiment shown in FIG. 7, this flexible and/or movable housing part is disposed on the suction side of the circulation pump 12.

In the variant shown in FIG. 7, the circulation pump 12 is once again held on the object 14 by means of holding clips 94. The bracket region 102 in this case acts directly on the flexible and/or movable housing part 104 and therefore exerts a positive pressure on the system in order to prevent air from entering into the system. The fixing device 92 and the holding clips 94 therefore serve both to fix the circulation pump 12 to the object 14 and to exert said positive pressure on the system.

In the exemplary embodiment shown in FIG. 6, the positive pressure is exerted indirectly via the holding clips 94 as a result of the housing 18 of the circulation pump 12 being pressed onto the object 14 if the thermal contact element is flexibly and/or movably.

In the embodiment shown in FIG. 7, the fixing device 92 exerts a force directly on the flexible and/or movable housing part 104.

While particular embodiments of the present invention have been disclosed, it is to be understood that various different modifications and combinations are possible and are contemplated within the true spirit and scope of the appended claims. There is no intention, therefore, of limitations to the exact abstract and disclosure herein presented.

The invention claimed is:

1. A device for the local cooling or heating of an object by means of a fluid, comprising:
   a circulation pump for the fluid; and
   a thermal contact element for making thermal contact with the object including physical contact with the object, said thermal contact element being integrated in said circulation pump,
   wherein the circulation pump has a housing part which is flexible and/or movable, said housing part being the thermal contact element.

2. The device according to claim 1, wherein the thermal contact element provides a housing cover of the circulation pump.

3. The device according to claim 1, wherein the thermal contact element defines a boundary of a swirl chamber of the circulation pump.

4. The device according to claim 3, wherein an impeller is rotatably arranged in the swirl chamber.

5. The device according to claim 4, wherein the circulation pump has a cover plate for the impeller.

6. The device according to claim 4, wherein a through-flow generated by the impeller is guided past the thermal contact element.

7. The device according to claim 4, wherein the impeller is arranged facing the thermal contact element.

8. The device according to claim 1, wherein the thermal contact element is made from a metallic material.

9. The device according to claim 1, wherein the thermal contact element is configured substantially as a plate.

10. The device according to claim 1, wherein the circulation pump is a centrifugal pump.

11. The device according to claim 10, wherein a substantially spherical bearing is provided for a rotor of the circulation pump.

12. The device according to claim 10, wherein the circulation pump comprises an electric motor having a stator and a rotor, between which a substantially spherical gap is formed.

13. The device according to claim 1, wherein a feed line for liquid medium is connected to a housing of the circulation pump transversely with respect to an axis of rotation of a rotor of the circulation pump.

14. The device according to claim 1, wherein a discharge line for liquid medium is connected to a housing of the circulation pump transversely with respect to an axis of rotation of a rotor of the circulation pump.

15. The device according to claim 1, wherein a discharge line for discharging liquid medium from the circulation pump and a feed line for feeding liquid medium to the circulation pump are connected to the same side of a housing of the circulation pump.

16. The device according to claim 1, wherein the thermal contact element is arranged on a pressure side of the circulation pump.

17. The device according to claim 1, wherein the thermal contact element has fins on an inner side of the thermal contact element.

18. The device according to claim 17, wherein the fins are adapted to promote turbulence.

19. The device according to claim 1, wherein a swirl chamber of the circulation pump has a variable volume.

20. The device according to claim 1, wherein the housing part which is flexible and/or is movable exerts a positive pressure on the object.

21. The device according to claim 20, wherein the positive pressure is exerted on the object by a fixing device for fixing the circulation pump to the object.

22. The device according to claim 1, wherein the circulation pump is affixed to the object by means of one or more holding clips.

* * * * *